United States Patent
Yen et al.

(10) Patent No.: US 10,678,138 B2
(45) Date of Patent: Jun. 9, 2020

(54) EXTREME ULTRAVIOLET (EUV) RADIATION SOURCE AND A METHOD FOR GENERATING EXTREME ULTRAVIOLET RADIATION

(71) Applicant: TAIWAN SEMICONDUCTOR MANUFACTURING COMPANY LTD., Hsinchu (TW)

(72) Inventors: Wei-Chun Yen, Hsinchu (TW); Chi Yang, Taichung (TW); Shang-Chieh Chien, New Taipei (TW); Li-Jui Chen, Hsinchu (TW); Po-Chung Cheng, Chiayi County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/245,774

(22) Filed: Jan. 11, 2019

(65) Prior Publication Data
US 2020/0041908 A1 Feb. 6, 2020

Related U.S. Application Data
(60) Provisional application No. 62/712,539, filed on Jul. 31, 2018.

(51) Int. Cl.
*G03F 7/00* (2006.01)
*G03F 7/20* (2006.01)

(52) U.S. Cl.
CPC ...... *G03F 7/70033* (2013.01); *G03F 7/70875* (2013.01)

(58) Field of Classification Search
USPC ...................................... 250/504 R
See application file for complete search history.

(56) References Cited

U.S. PATENT DOCUMENTS 9,429,858 B2 * 8/2016 Chien ............... G03F 7/2008
9,753,372 B2 * 9/2017 Franken ............. H05G 2/005
9,986,628 B2 * 5/2018 Loopstra .......... G03F 7/7085

* cited by examiner

*Primary Examiner* — Phillip A Johnston
(74) *Attorney, Agent, or Firm* — WPAT, P.C., Intellectual Property Attorneys; Anthony King

(57) ABSTRACT

The EUV radiation source includes a rotatable EUV source vessel configured to collect fuel debris generated from the collision of fuel droplets and a laser beam. The source vessel includes an inner surface for receiving the fuel debris, an first aperture at one end of the inner surface, and a heater adjacent to the inner surface and configured to generate a heating area on the inner surface in coordination with a rotation speed of the source vessel. The fuel debris is reflowed to the heating area. A method for generating EUV radiation includes collecting fuel debris on an inner surface of a source vessel, rotating the source vessel at a rotation speed, and heating a portion of the source vessel to an elevated temperature to generate a heating area on the inner surface in coordination with the rotation speed. The fuel debris is reflowed to the heating area.

20 Claims, 8 Drawing Sheets

EXTREME ULTRAVIOLET (EUV) RADIATION SOURCE AND A METHOD FOR GENERATING EXTREME ULTRAVIOLET RADIATION

PRIORITY CLAIM AND CROSS-REFERENCE

This application claims priority of U.S. provisional application Ser. No. 62/712,539 filed on 31 Jul. 2018, which is incorporated by reference in its entirety.

BACKGROUND

Extreme ultraviolet (EUV) radiation, e.g., electromagnetic radiation having wavelengths of around 50 nm or less, and including light at a wavelength of about 13.5 nm, can be used in photolithography processes to produce extremely small features in substrates such as silicon wafers. Methods for generating EUV radiation include converting a fuel material from a liquid state into a plasma state. In the plasma state, the fuel material emits photons having the desired wavelength, which is provided as EUV radiation.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
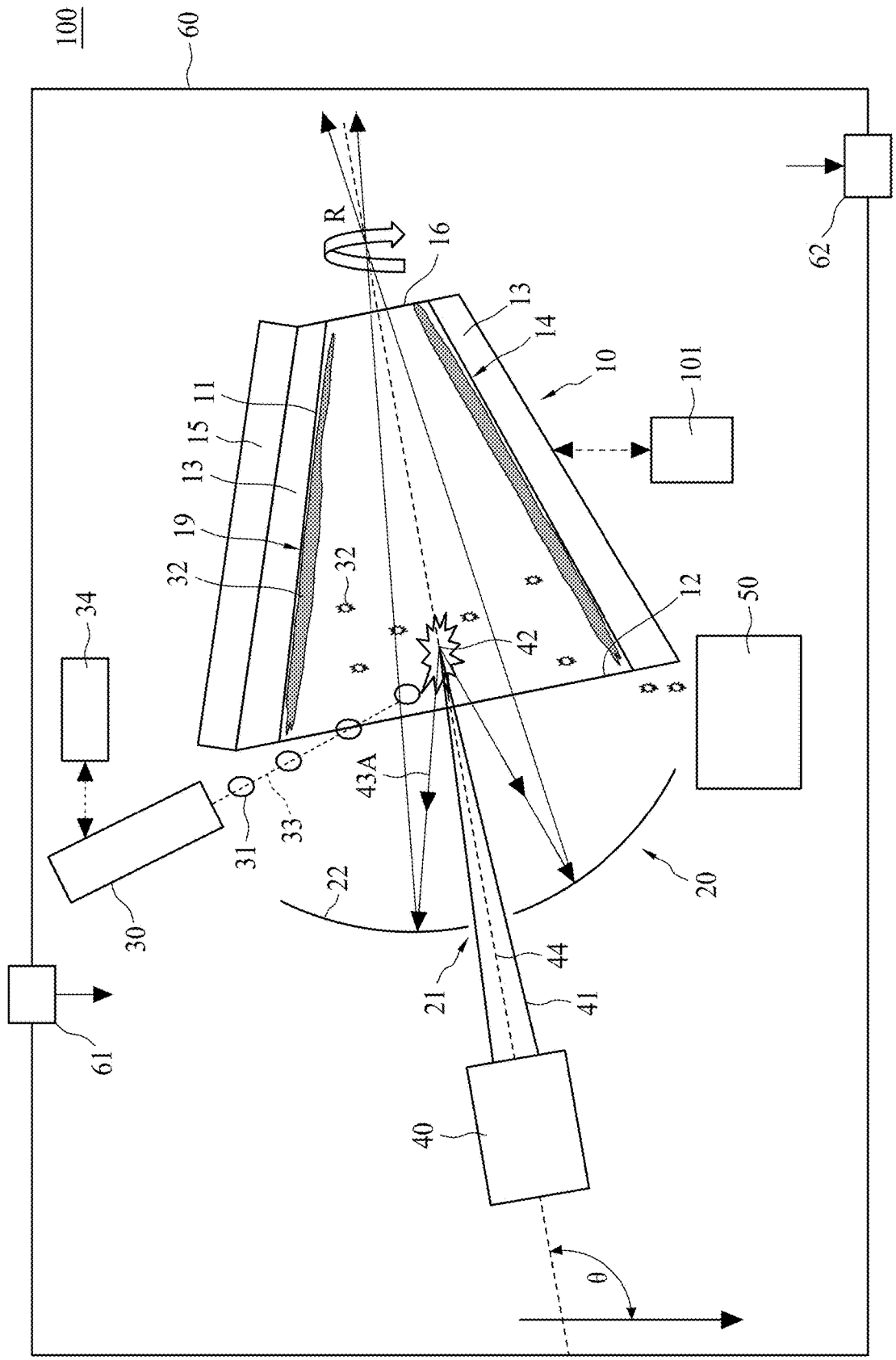
FIG. 1 is an illustration of an EUV radiation source according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

The EUV radiation source generally includes a fuel droplet generator that provides a plurality of fuel droplets to an EUV source vessel. A laser is configured to generate a laser beam directed towards the plurality of fuel droplets. As the fuel droplets enter the EUV source vessel, the laser beam hits the fuel droplets and heats the fuel droplets to a critical temperature that causes atoms of the fuel to shed their electrons and form a plasma of ionized fuel droplets. The plasma of ionized fuel droplets emits photons having a wavelength less than 50 nm, which is provided as EUV radiation. A collector is configured to focus the EUV radiation toward an exit at one end of the EUV source vessel and onto a semiconductor workpiece.

In some embodiments, when the fuel droplets are struck by the laser beam, fuel debris from the collision may be sprayed onto the inner surface of the EUV source vessel. As fuel debris accumulates on the inner surface of the EUV source vessel, the fuel debris may fall onto the collector. The fuel debris collects on the collector, causing the collector to lose reflectivity and require replacement. Replacement of the collector is a time-consuming process that requires stopping the generation of EUV radiation.

Typically, a method for removing fuel debris from the inner surface of the EUV source vessel includes stopping the supply of the laser beam and heating the entire EUV source vessel to redirect the fuel debris. In some embodiments, the EUV source vessel further has an aperture at the other end of the EUV source vessel for an exit of the reflowed fuel debris. The reflowed fuel debris is directed to flow along the inner surface and exit from the aperture, then flow into a detachable debris-collection element configured to receive the fuel debris from the EUV source vessel. The debris-collection element is located between the EUV source vessel and the collector mirror. However, when too much reflowed fuel debris flows out from the EUV source vessel at one time, the reflowed fuel droplets may overflow to the collector mirror, causing the collector to become contaminated and require replacement.

The present disclosure therefore provides an extreme ultraviolet (EUV) radiation source and a method for generating EUV radiation. The EUV radiation source includes a rotatable EUV source vessel configured to collect fuel debris generated from the collision of fuel droplets and a laser beam. Further, a heater is configured to generate a heating area on the inner surface of the rotatable vessel in coordination with a rotation speed of the rotatable EUV source vessel, such that the fuel debris reflowed to the heating area. Accordingly, the collector contamination issue is mitigated and EUV radiation yield is improved.

FIG. 1 is a schematic drawing illustrating an EUV radiation source 100 according to aspects of the present disclosure in some embodiments. Referring to FIG. 1, the EUV radiation source 100 includes a rotatable EUV source vessel 10 configured to collect the fuel debris 32 generated from the collision of the fuel droplets 31 and a laser beam 41. The rotatable EUV source vessel 10 includes an inner surface 11 for receiving the fuel debris 32, a first aperture 12 at one end of the inner surface, and a heater 13 adjacent to the inner surface 11 and configured to generate a heating area 14 on the inner surface 11 in coordination with a rotation speed R of the EUV source vessel 10. The fuel debris 32 reflows to the heating area 14.

In some embodiments, the EUV radiation source 100 further comprises a fuel droplet generator 30 configured to provide a plurality of the fuel droplets 31 to the rotatable EUV source vessel 10 along a first trajectory 33. In some embodiments, the first trajectory 33 may be in a substantially same direction as a gravitational force. In other embodiments, the first trajectory 33 may be in a different direction than the gravitational force. In some embodiments, the fuel droplet generator 30 is configured to provide fuel droplets 31 having a diameter of less than or equal to approximately 20 microns. In some embodiments, the fuel droplets 31 include tin.

In some embodiments, the extreme ultraviolet (EUV) radiation source 100 further includes a droplet metrology system 34 configured to determine the position and/or trajectory 33 of the plurality of fuel droplets 31. In some embodiments, information from the droplet metrology system 34 may be provided to the laser source 40, which can then adjust the position of the laser beam 41 to intersect the first trajectory 33 of the plurality of fuel droplets 31.

The laser beam 41 intersects the plurality of fuel droplets 31 to generate plasma of ionized fuel droplets and fuel debris 32. The plasma emits EUV radiation. Plasma can be formed in any suitable manner. In some embodiments, the EUV radiation 43 may have a wavelength between about 3 nm and about 50 nm. In some embodiments, the EUV radiation may have a wavelength between about 3 nm and about 15 nm. In some embodiments, the EUV radiation 43 may have a wavelength of approximately 13.5 nm. In some embodiments, the laser beam 41 may include a carbon dioxide ($CO_2$) laser. In some embodiments, the laser beam 41 may have principal wavelength bands centered around a range of between approximately 9 um and approximately 11 um and an energy of greater than or equal to approximately 11.9 MeV. In some embodiments, the laser beam 41 is provided by a laser source 40.

Figure 2:
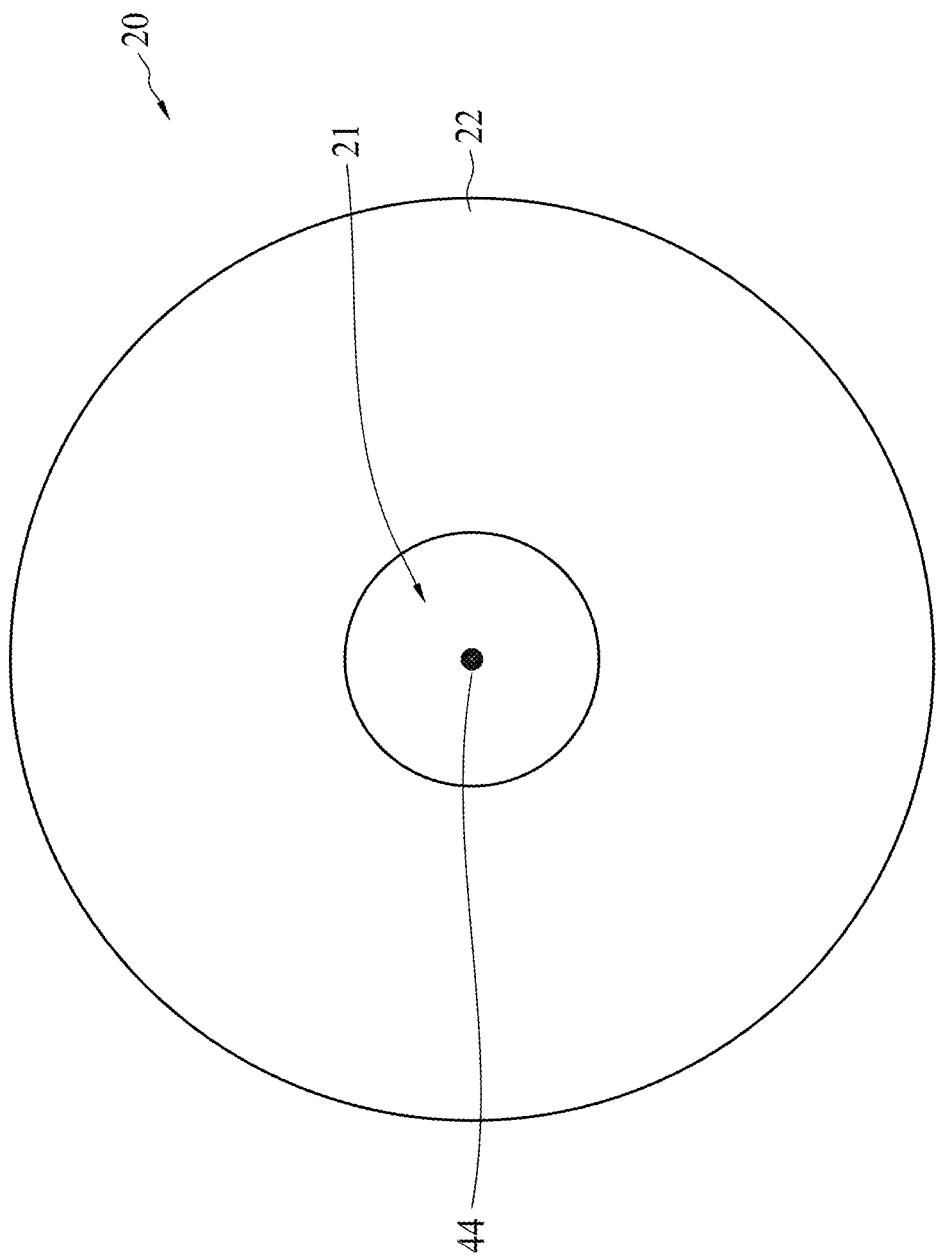
FIG. 2 illustrates a collector in accordance with embodiments of the present disclosure.

Please refer to FIGS. 1 and 2, wherein FIG. 2 is a top view of a collector 20. In some embodiments, the EUV radiation source 100 further comprises a collector 20 detachable from the rotatable EUV source vessel 10. The collector 20 is configured to focus the EUV radiation 43 toward a second aperture 16 at the other end of the inner surface 11 of the rotatable EUV source vessel 10. In some embodiments, the collector 20 is an optical element. In some embodiments, the collector 20 may be a normal incidence reflector such as, for example, a mirror. In some embodiments, the collector 20 has a mirror surface 22. In some embodiments, the mirror surface 22 of the collector 20 is generally dish-shaped. In some embodiments, the mirror surface 22 is an ellipsoid. In some embodiments, the mirror surface 22 has a solid angle in the ranges from about 1 to about 6 steradians. In some embodiments, the collector 20 has an opening 21 for allowing the laser beam 41 to pass through. The position of the opening 21 is not particularly limited. In some embodiments, the opening 21 is at the center of the collector 20.

Referring back to FIG. 1, in some embodiments, steps performed by the extreme ultraviolet (EUV) radiation source 100 used to generate EUV radiation includes focusing a laser beam 41 from the laser source 40 on a target 42, and shooting fuel droplets 31 to the target 42. The laser beam 41 hits the fuel droplets 31 at the target 42 to generate plasma, which emits EUV radiation 43. In some embodiments, the EUV radiation 43 is widely scattered and reflected by the mirror surface 22 of the collector 20 to provide reflected EUV radiation 43. The collector 20 collects the EUV light 43 by reflecting and focusing the EUV radiation 43, causing the EUV radiation 43 to enter the rotatable EUV source vessel 10 and then exit the rotatable EUV source vessel 10 via the second aperture 16. In some embodiments, the laser source 40, the opening 21 of the collector 20, the target 42, the first aperture 12 and the second aperture 16 of the rotatable EUV source vessel 10 are arranged along an axis of symmetry 44. In some embodiments, the axis of symmetry 44 is oriented at an angle θ to the direction of gravity, the angle θ causes reflowed fuel debris 32 on the heating area 14 to flow along the inner surface 11 toward the first aperture 12. In some embodiments, the angle θ ranges between 90° and 180. In some embodiments, the angle θ ranges from 95° to 180°. In some embodiments, the first aperture 12 is lower than the second aperture 16 in the direction of gravity.

In some embodiments, the target 42 is located in the rotatable EUV source vessel 10. In other words, the collision occurs in the rotatable EUV source vessel 10. In some embodiments, the fuel debris 32 generated from the collision may splash or fall onto the inner surface 11 of the rotatable EUV source vessel 10.

Figure 3:
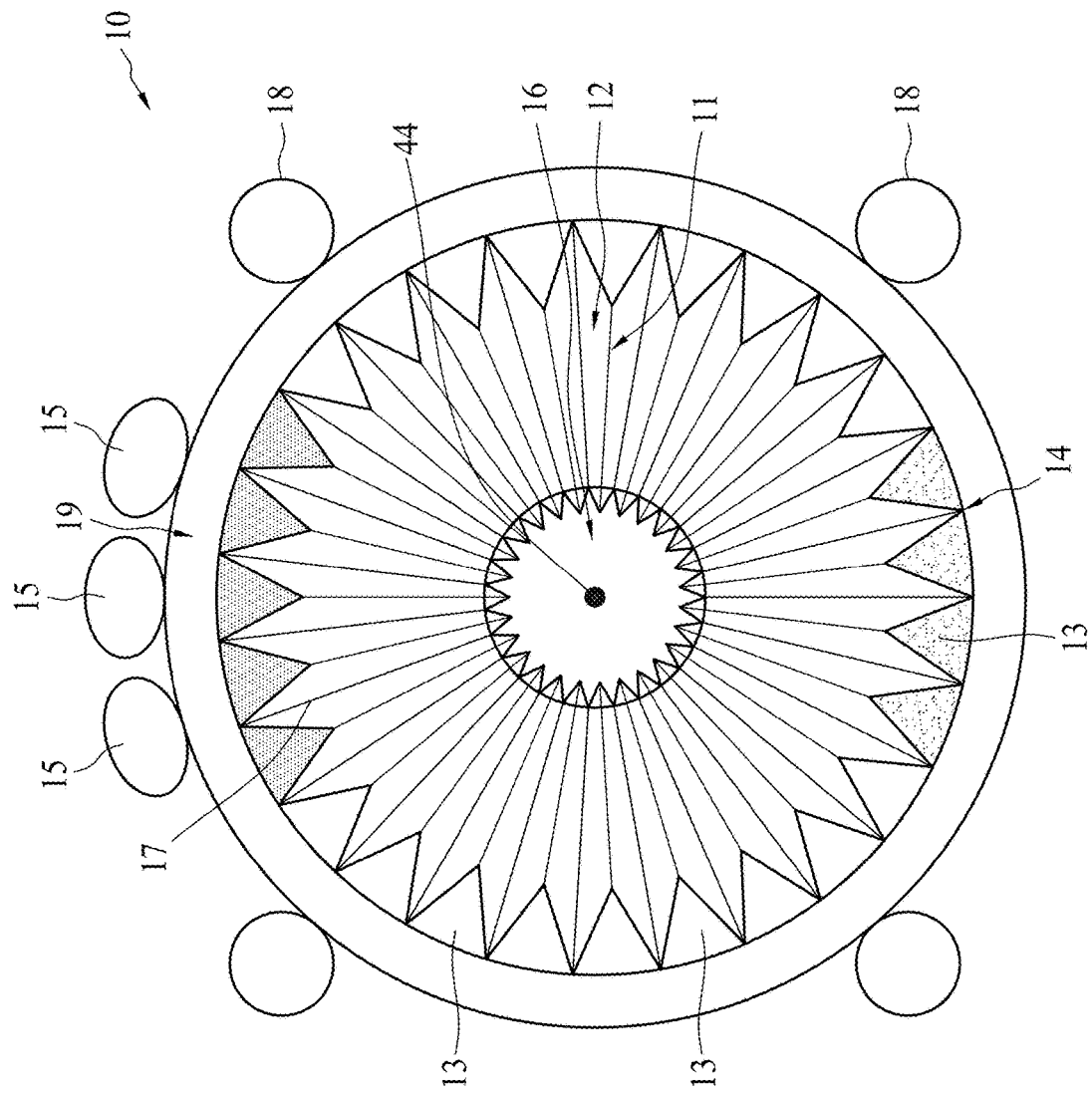
FIG. 3 illustrates a rotatable EUV source vessel in accordance with embodiments of the present disclosure.

Please refer to FIGS. 1 and 3, wherein FIG. 3 is a back view of the rotatable EUV source vessel 10. In some embodiments, the axis of symmetry 44 passes through the center of the first aperture 12 and the center of the second aperture 16. In some embodiments, the rotatable EUV source vessel 10 is cylindrical or conical, but the disclosure is not limited thereto. The heater 13 is configured to generate a heating area 14 on the inner surface 11 of the rotatable EUV source vessel 10. The arrangement or type of the heater 13 is not particularly limited as long as the fuel debris 32 at the heating area 14 can be reflowed. The inner surface 11 is not limited to being a smooth surface or a curved surface; in some embodiments, the inner surface 11 may match the shape of the heater 13 with undulations or fluctuations. In some embodiments, the rotatable EUV source vessel 10 includes a plurality of heaters 13 evenly distributed in the rotatable EUV source vessel 10 adjacent to the inner surface. In some embodiments, each heater 13 can operate independently. In some embodiments, the heater 13 is strip-shaped.

In some embodiments, the rotatable EUV source vessel 10 includes a plurality of strip-shaped heaters 13 adjacent to the inner surface, and the inner surface 11 has a plurality of grooves 17. In some embodiments, the grooves 17 drain the reflow fuel debris 32. In some embodiments, the heater 13 is detachable.

In some embodiments, the heater 13 is configured to heat the heating area 14 to an elevated temperature in order to reflow the fuel debris 32. In some embodiments, the elevated temperature is about 100 to 500° C. when the fuel debris 32 includes tin. In some embodiments, the heating area 14 extends from the first aperture 12 to the second aperture 16 and is located on one side of the rotatable EUV source vessel 10. In some embodiments, the heating area 14 is on one side of the axis of symmetry 44. In some embodiments, the rotatable EUV source vessel 10 is inclined, that is, the axis of symmetry 44 is oriented at an angle θ to the direction of gravity, and the heating area 14 is on one side of the axis of symmetry 44. Accordingly, the reflowed fuel debris 32 on the heating area 14 is able to exit through the first aperture 12 of the rotatable EUV source vessel 10 due to gravity.

In some embodiments, the rotatable EUV source vessel 10 is mounted so as to allow it to rotate around the axis of symmetry 44. In some embodiments, the rotatable EUV source vessel 10 is rotatably mounted to a support (not shown). In some embodiments, the rotatable mounting can be any type of mounting that permits rotation of the rotatable EUV source vessel 10. In some embodiments, the rotatable mounting can be any mounting system that holds the rotatable EUV source vessel 10 in position for generating EUV radiation and permits the rotatable EUV source vessel 10 to be rotated without detaching it from its mounting. In some embodiments, the rotatable mounting can be on a rotating shaft or on bearings. In some embodiments, the rotatable mounting includes mounting on a roller 18. In some embodiments, the roller can be rotated clockwise or counterclockwise. In some embodiments, the rotatable mounting includes mounting the rotatable EUV source vessel 10 on a plurality of rollers 18. In some embodiments, the rollers can all be rotated clockwise or counterclockwise.

In some embodiments, the rotatable EUV source vessel 10 is rotated periodically with respect to the operation of the EUV radiation source 100. A periodic rotation can be periodic with respect to any parameter that advances as the EUV radiation source 100 operates. Examples of parameters against which a period between rotations can be include, without limitation, number of laser beams 41, time of operation, number of fuel droplets 31, and amount of EUV radiation 43 generated. The amount of each rotation can also be set in any suitable manner. In some embodiments, the rotation is through a fixed angle for each period, such as 5°, 15°, 45°, 90°, or 180°. The amount of rotation at each interval can be variable. In some embodiments, the amount of rotation is randomly set for each interval. In some of these embodiments, the rotatable EUV source vessel 10 is rotated periodically as previously described, but in other embodiments, the rotatable EUV source vessel 10 is rotated continuously while the EUV radiation source 100 is operating and generating EUV radiation 43.

Rotation of the rotatable EUV source vessel 10 can be manual. However, in some embodiments, the rotatable EUV source vessel 10 is configured for automatic rotation. In some embodiments, automatic rotation is driven by a controller 101. In some embodiments, the controller 101 can be mechanically coupled to the rotatable EUV source vessel 10.

In some embodiments, the controller 101 can be coupled to drive rotation of the rotatable EUV source vessel 10 through at least one of the rollers 18.

In some embodiments, the controller 101 is configured to coordinate the heating area 14 and the rotation speed R. In some embodiments, the controller 101 detects the operating parameters of the rotatable EUV source vessel 10 and controls the rotation speed R and rotation period of the rotatable EUV source vessel 10 based on the detected operating parameters and process requirements. In some embodiments, the operating parameters include the heating time of the heating area 14, the temperature of the heating area 14, the weight of the rotatable EUV source vessel 10, the rate and amount of fuel droplets 31 provided by the fuel droplet generator 30, the laser beam 41 provided by the laser source 40, the operation of the heater 13, the operation of the cooler 15, and the pressure in the rotatable EUV source vessel 10, but the disclosure is not limit thereto.

In some embodiments, the rotatable EUV source vessel 10 further comprises a detachable cooler 15 configured to be positioned in a location adjacent to the inner surface 11 and generating a warm area 19 opposite to the heating area 14. It is desirable that the fuel debris 32 on the warm area 19 has low fluidity due to a relatively low temperature, and the fuel debris 32 is not easy to flow or fall onto the collector 20. The region of the warm area 19 is not particularly limited as long as it is substantially opposite to the heating area 14 and prevents the fuel debris 32 on the warm area 19 from flowing or falling onto the mirror surface 22 of the collector 20.

In some embodiments, design and arrangement of the cooler 15 depends on the desired region of the warm area 19. In some embodiments, the detachable cooler 15 is configured to be positioned in a location adjacent to the inner surface 11 and substantially opposite to the heating area 14. In some embodiments, the detachable cooler 15 is configured to be positioned at an outer surface of the rotatable EUV source vessel 10. In some embodiments, a plurality of detachable coolers 15 are configured to be positioned in a location adjacent to and surrounding the inner surface, and as the rotatable EUV source vessel 10 rotates, only the detachable coolers 15 substantially opposite to the heating area 14 are operated.

In some embodiments, the cooler 15 is a cooling tube. In some embodiments, the cooling tube has an inner channel for accommodating a coolant. In some embodiments, the coolant is water. However, any other suitable coolant may be used, including liquid nitrogen, argon, oxygen, hydrogen, helium, fluorine, methane, neon, carbon monoxide, and combinations thereof. In some embodiments, the cooler 15 containing the coolant is placed in contact with the rotatable EUV source vessel 10 for a period of time. The amount of time for which the fuel debris 32 is cooled will be affected by the type of the coolant, the cooler 15, the rotatable EUV source vessel 10 and the heater 13.

In some embodiments, the rotatable EUV source vessel 10 further comprises a debris-collection element 50 configured to collect fuel debris 32 coming out of the first aperture 12 of the rotatable EUV source vessel 10. In some embodiments, the debris-collection element 50 is located below the first aperture 12 of the rotatable EUV source vessel 10. In some embodiments, the debris-collection element 50 is located below the first aperture 12 of the rotatable EUV source vessel 10 and the collector 20.

In some embodiments, the EUV radiation source 100 is enclosed in a processing chamber 60. In some embodiments, the processing chamber 60 is held under vacuum (e.g., at a pressure of less than 2 mbar). In some embodiments, the processing chamber 60 is held under a hydrogen atmosphere. It should be noted that, when the fuel debris 32 includes tin, hydrogen mixing with the reflowed tin debris in a high temperature environment may cause an explosion. The explosion causes the fuel debris 32 to spray and contaminate the inner surface 11 of the rotatable EUV source vessel 10. Under current practices, the EUV radiation source 100 stops generating EUV radiation before the processing chamber 60 is filled with hydrogen and the rotatable EUV source vessel 10 is heated. However, in the present disclosure, even if the rotatable EUV source vessel 10 is filled with hydrogen, since the fuel debris 32 is reflowed only to the heating area 14, the explosion does not occur on the entire inner surface. Further, once the fuel debris 32 is reflowed, the fuel debris 32 reflowed to the heating area 14 exits from the first aperture 12 of the rotatable EUV source vessel 10 due to gravity, significantly reducing the probability of an explosion.

In some embodiments, the hydrogen atmosphere is attained when the hydrogen gas is at a pressure between 0.1 and 4 torr. In some embodiments, the processing chamber 60 includes a gas inlet 61 and a gas outlet 62. The gas inlet 61 and gas outlets are configured to provide entry to and exit from the atmosphere, respectively. In some embodiments, additional components may also be enclosed in the processing chamber 60.

Figure 4:
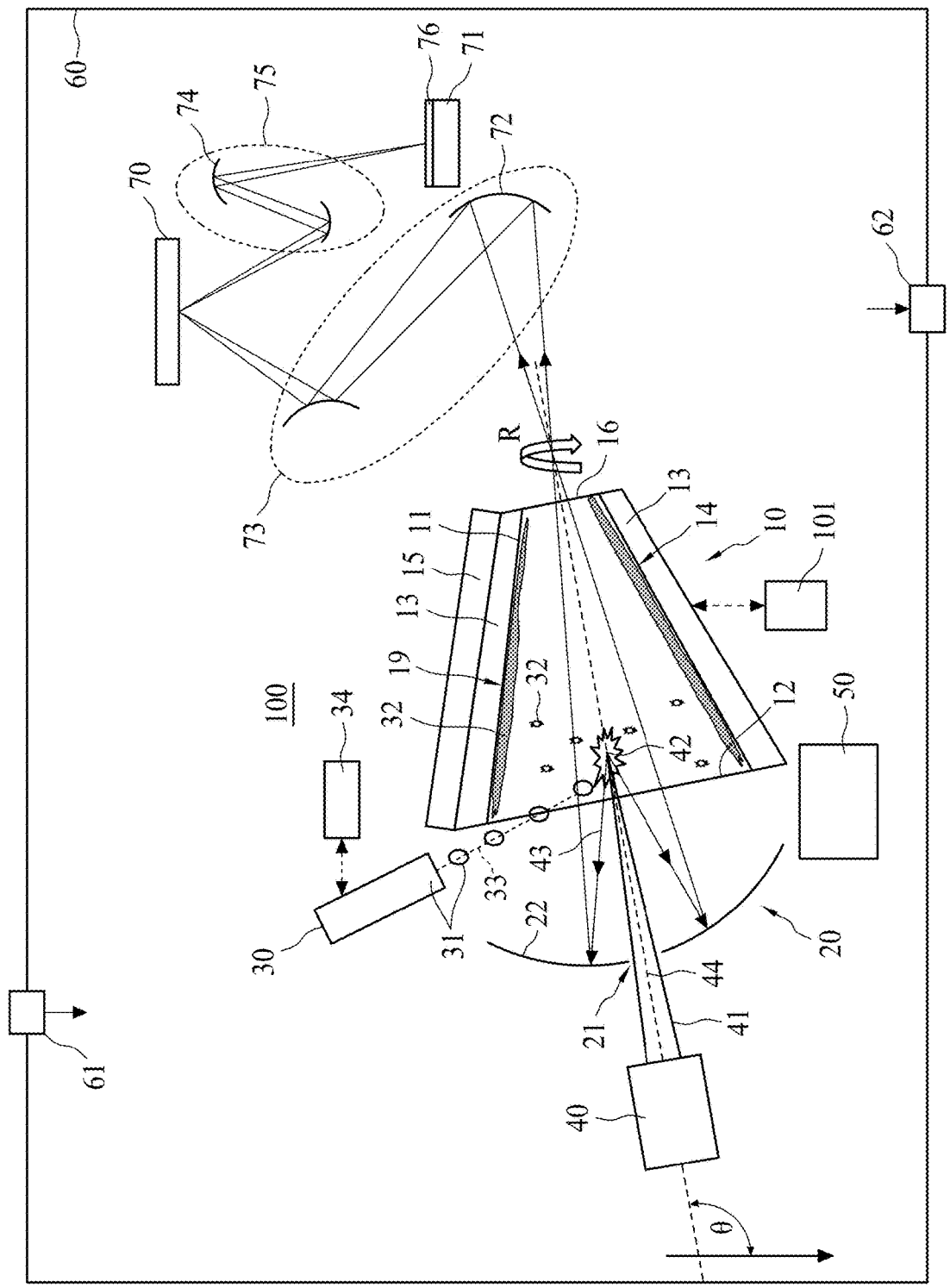
FIG. 4 is an illustration of an EUV radiation source according to aspects of the present disclosure in one or more embodiments.

FIG. 4 is a schematic drawing illustrating an EUV radiation source 100 according to aspects of the present disclosure in some embodiments. In some embodiments, additional components include a reticle 70 and a wafer 71, but are not limited thereto. The EUV radiation source 100 is configured to supply EUV radiation 43 to a reticle 70 having a patterned multi-layered reflective surface. In some embodiments, the collector 20 collects EUV radiation 43 by reflecting it and focusing it on a reflector 72 of a condenser system 73. The condenser system 73 is configured to focus the EUV radiation 43, and the reflector 72 is configured to reflect the EUV radiation 43 towards the reticle 70. The reticle 70 is configured to reflect the EUV radiation 43 to form a pattern on a photoresist 76. The reflector 72 further reflects the collected EUV radiation 43 off the reticle 70, wherein the reticle 70 forms an image from the EUV radiation 43. The image is reflected from the optics 74 of a projection system 75, which transfers the EUV radiation 43 onto the photoresist 76 coated on the wafer 71. The EUV radiation 43 generated from the EUV radiation source 100 thereby selectively exposes the photoresist 76 in a pattern defined by the reticle 70.

Figure 5:
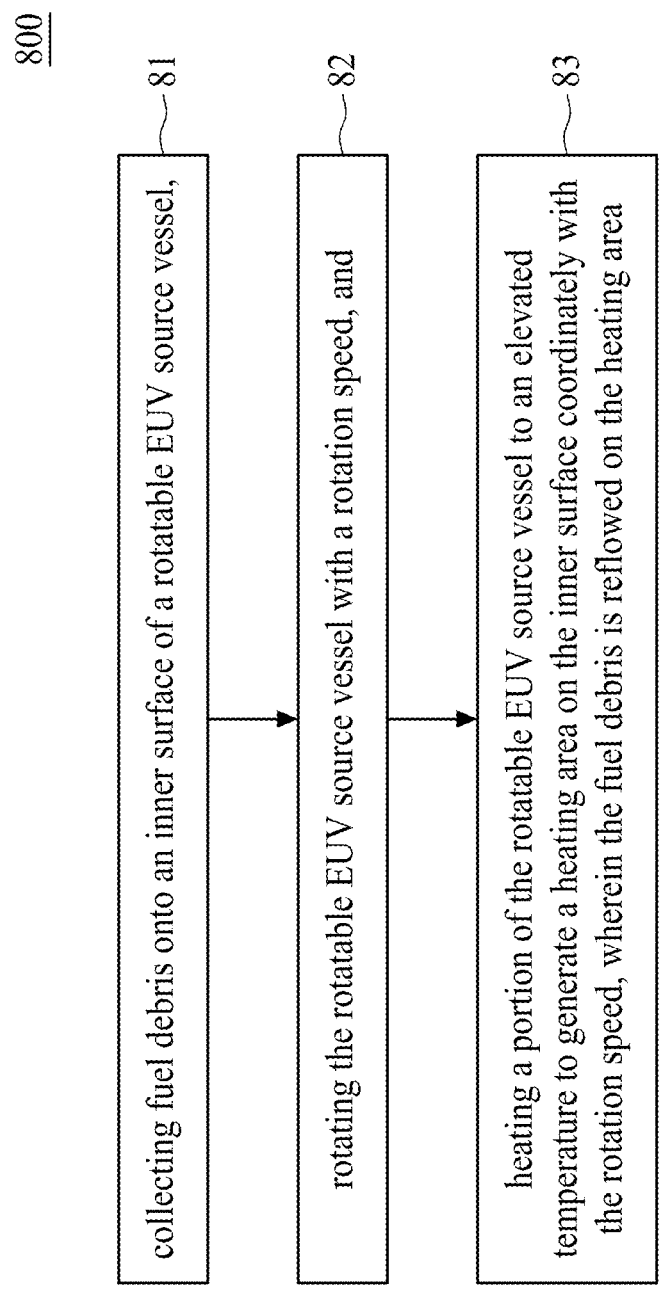
FIG. 5 shows a flowchart representing a method for generating EUV radiation according to aspects of the present disclosure in one or more embodiments.
Figure 7:
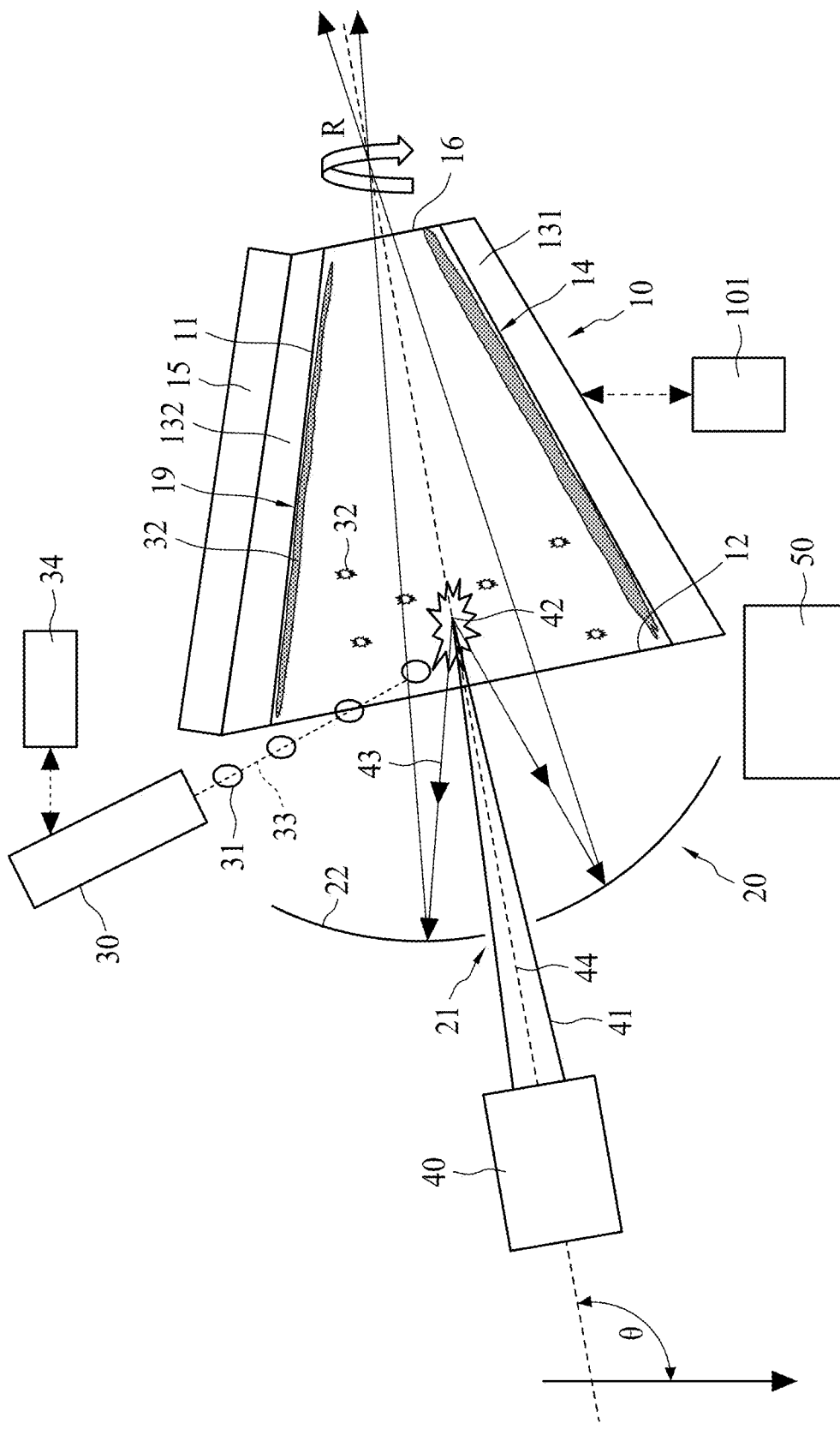
FIG. 7 is an illustration of an EUV radiation source according to aspects of the present disclosure in one or more embodiments.

Please refer to FIG. 5. FIG. 5 shows a flowchart representing a method for generating EUV radiation according to aspects of the present disclosure. In the present disclosure, a method for generating EUV radiation 800 is also disclosed. In some embodiments, fuel debris 32 may be removed while generating the EUV radiation 43 by the method 800. The method 800 includes a number of operations and the description and illustration are not deemed as a limitation of the sequence of the operations. The method 800 includes a number of operations 81, 82 and 83 as shown in FIG. 7.

The method 800 includes collecting fuel debris 32 onto an inner surface 11 of the rotatable EUV source vessel 10, rotating the rotatable EUV source vessel 10 at a rotation speed R, and heating a portion of the rotatable vessel 10 to an elevated temperature to generate a heating area 14 on the inner surface 11 in coordination with the rotation speed R, wherein the fuel debris 32 is reflowed to the heating area 14. In operation 81, the fuel debris 32 may be attached to the entire inner surface 11. In operations 82 and 83, rotating the rotatable EUV source vessel 10 must be performed in coordination with the heating of the heating area 14. In some embodiments, the operations 81, 82, and 83 can be performed simultaneously.

Figure 6:
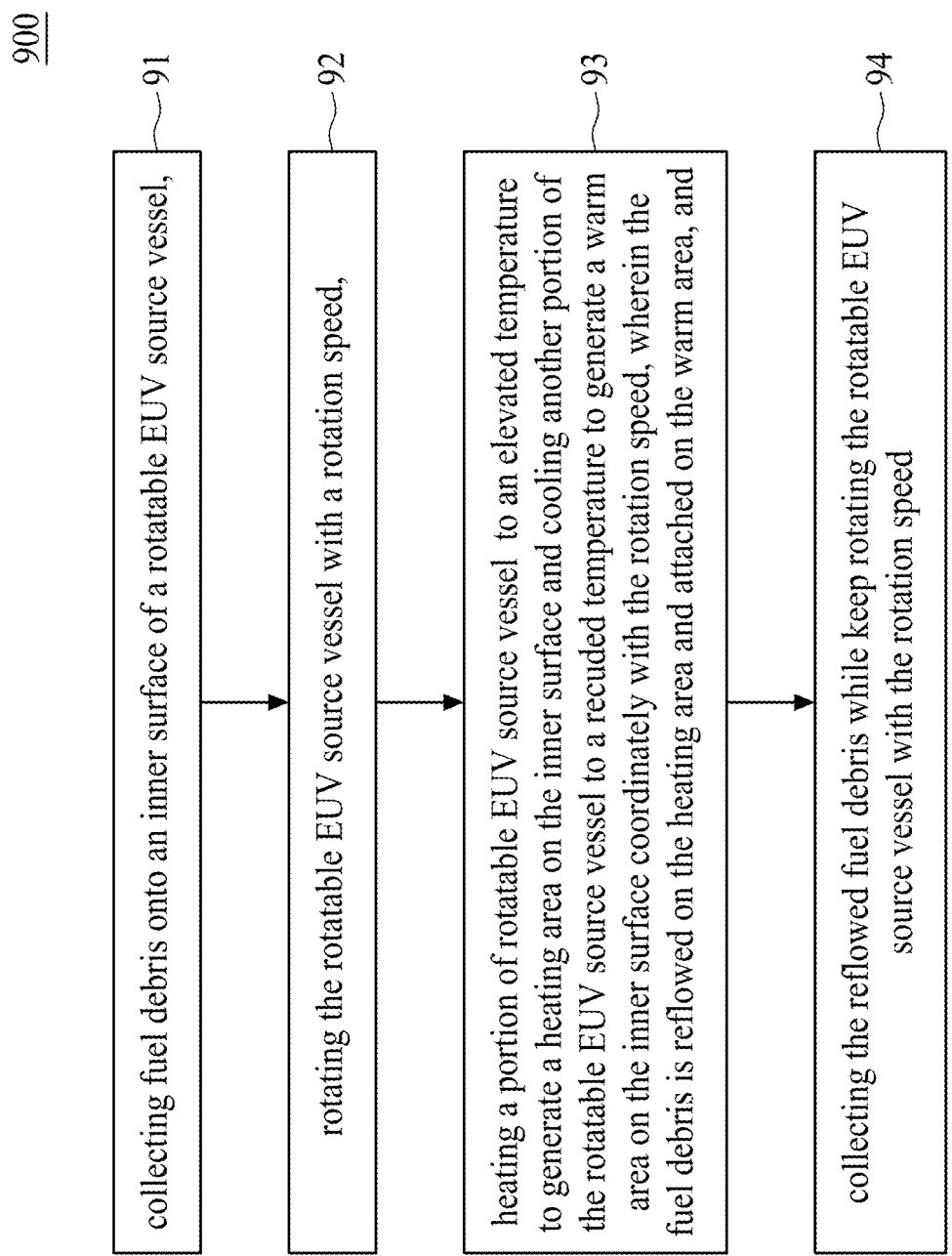
FIG. 6 shows a flowchart representing a method for generating EUV radiation according to aspects of the present disclosure in one or more embodiments.

Please refer to FIG. 6. FIG. 6 shows a flowchart representing a method for generating EUV radiation according to aspects of the present disclosure. In the present disclosure, another method for generating EUV radiation 900 is disclosed. In some embodiments, fuel debris 32 may be removed while the EUV radiation 43 is generated according to the method 900. The method 900 includes a number of operations and the description and illustration are not deemed as a limitation as the sequence of the operations. The method 900 includes operations 91, 92, 93 and 94 as shown in FIG. 6.

The difference between the method 900 and the aforementioned method 800 is that the operation 93 of the method 900 includes heating a portion of the rotatable EUV source vessel 10 to an elevated temperature to generate a heating area 14 on the inner surface 11 and cooling another portion of the rotatable EUV source vessel 10 to a reduced temperature to generate a warm area 19 on the inner surface 11 in coordination with the rotation speed R, wherein the fuel debris 32 is reflowed to the heating area 14 and attached on the warm area 19. The method 900 further includes operation 94. In operation 94, the reflowed fuel debris 32 is collected while the rotatable EUV source vessel 10 is kept rotating at the rotation speed R.

In some embodiments, the rotatable EUV source vessel 10 can be rotated while the EUV radiation source 100 is operating and the processing chamber 60 is closed. In some embodiments, fuel debris 32 is removed by continuous rotation of the rotatable EUV source vessel 10 during operation of the EUV radiation source 100 in coordination with the heating of the heating area 14.

Figure 8:
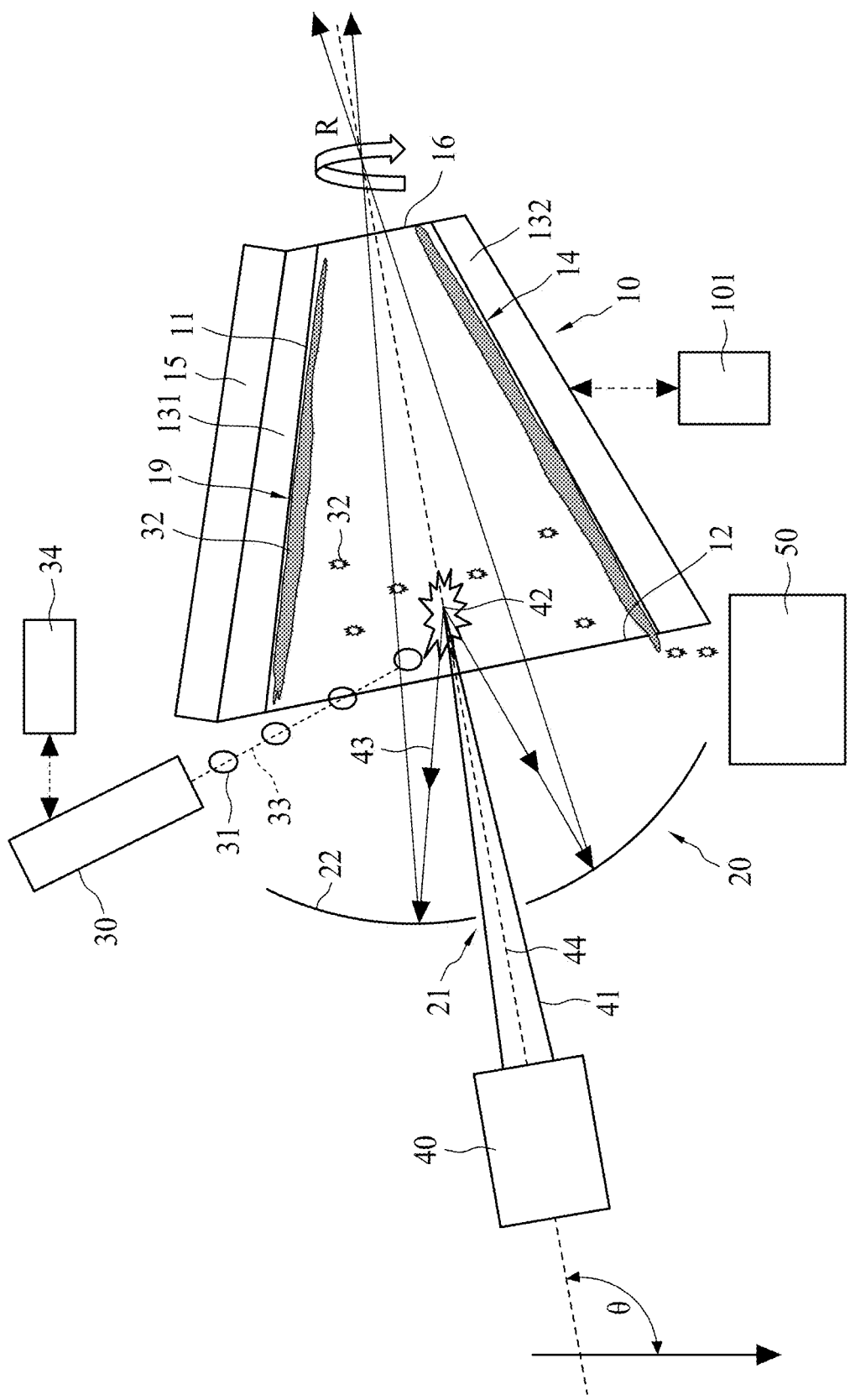
FIG. 8 is an illustration of an EUV radiation source according to aspects of the present disclosure in one or more embodiments.

FIGS. 7 and 8 are schematic drawings of the EUV radiation source 100 in operation according to aspects of the present disclosure in one or more embodiments. In some embodiments, the heater 13 includes a first heating strip 131 and a second heating strip 132 positioned in a location substantially opposite to the first heating strip 131. In some embodiments, referring to FIG. 5, the fuel debris 32 is collected onto an inner surface 11 of the rotatable EUV source vessel 10, and the rotatable EUV source vessel 10 is rotated at a rotation speed R. In some embodiments, the first heating strip 131 and the cooler 15 are turned on, forming the heating area 14, wherein the heating area 14 is located on one side of the axis of symmetry 44 and extends from the first aperture 12 to the second aperture 16. The fuel debris 32 accumulating on the heating area 14 is heated by the first heating strip 132 and is reflowed. Due to the orientation of the axis of symmetry 44 at an angle θ to the direction of gravity, the reflowed fuel debris 32 on the heating area 14 flows along the grooves 17, exits the first aperture 12 of the rotatable EUV source vessel 10, and enters the debris-collection element 50 due to gravity. In some embodiments, the EUV radiation source 100 continues to generate EUV radiation 43 while discharging the fuel debris 32 on the heating area 14. The second heating strip 132 and the cooler 15 are located on the other side of the inner surface 11 and together generate the warm area 19. The second heating strip 132 can be turned off as needed. Because the temperature of the warm area 19 is lower than that of the heating area 14, the fuel debris 32 splashed onto the warm area 19 may accumulate in the grooves 17 in the warm area 19.

Referring to FIG. 6, compared to FIG. 5, the EUV radiation source 100 is rotated 180° by the controller 101, thereby moving the second heating strip 132 closer to the debris-collection element 50 than the first heating strip 131. In some embodiments, the second heating strip 132 and the cooler 15 are turned on, and the heating area 14 thus formed is located on one side of the axis of symmetry 44 and extends from the first aperture 12 to the second aperture 16. The fuel debris 32 accumulating on the heating area 14 is heated by the second heating strip 132 and is reflowed. Because the axis of symmetry 44 is oriented at an angle θ to the direction of gravity, the reflowed fuel debris 32 in the heating area 14 flows along the grooves 17, exits the first aperture 12 of the rotatable EUV source vessel 10, and enters the debris-collection element 50 due to gravity. In addition, the first heating strip 131 and the cooler 15 are located on the other side of the inner surface 11 and together generate the warm area 19, wherein the first heating strip 131 can be turned off as needed. Because the temperature of the warm area 19 is lower than that of the heating area 14, and because the warm area 19 has only a trace of fuel debris 32 or no fuel debris 32 at all, the fuel debris 32 splashed onto the warm area 19 may accumulate on the inner surface 11 without falling onto the collector 20.

Accordingly, the present disclosure therefore provides an EUV radiation source 100 and a method for generating EUV radiation. The EUV radiation source 100 includes a rotatable EUV source vessel 10. The rotatable EUV source vessel 10 includes a heating area on the inner surface in coordination with a rotation speed of the rotatable EUV source vessel, allowing the fuel debris in the heating area 14 to be reflowed and able to exit from the rotatable EUV source vessel 10. Consequently, the fuel debris 32 can be removed without stopping the generation of the EUV radiation 43 and without contaminating the collector 20.

In some embodiments, an EUV radiation source is provided. The EUV radiation source includes a rotatable EUV source vessel configured to collect fuel debris generated from the collision of fuel droplets and a laser beam. The rotatable EUV source vessel includes an inner surface for receiving the fuel debris, an first aperture at one end of the inner surface, and a heater adjacent to the inner surface and configured to generate a heating area on the inner surface in coordination with a rotation speed of the rotatable EUV source vessel. In some embodiments, the fuel debris is reflowed to the heating area.

In some embodiments, a method for generating EUV radiation is provided. The method includes collecting fuel debris on an inner surface of a rotatable EUV source vessel, rotating the rotatable EUV source vessel at a rotation speed, and heating a portion of the rotatable EUV source vessel to an elevated temperature to generate a heating area on the inner surface in coordination with the rotation speed. In some embodiments, the fuel debris is reflowed to the heating area.

In some embodiments, another method for generating EUV radiation is provided. The method includes collecting fuel debris on an inner surface of a rotatable EUV source vessel, rotating the rotatable EUV source vessel at a rotation speed, heating a portion of the rotatable EUV source vessel to an elevated temperature to generate a heating area on the inner surface and cooling another portion of the rotatable EUV source vessel to a reduced temperature to generate a warm area on the inner surface in coordination with the rotation speed, and collecting the reflowed fuel debris while the rotatable EUV source vessel is kept rotating at the rotation speed. In some embodiments, the fuel debris is reflowed to the heating area and attached to the warm area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) radiation source, comprising:
a rotatable EUV source vessel configured to collect fuel debris generated from the collision of fuel droplets and a laser beam, the rotatable EUV source vessel comprising:
an inner surface for receiving the fuel debris;
an first aperture at one end of the inner surface;
a heater adjacent to the inner surface and configured to generate a heating area on the inner surface in coordination with a rotation speed of the rotatable EUV source vessel, wherein the fuel debris is reflowed to the heating area.

2. The extreme ultraviolet (EUV) radiation source of claim 1, further comprising a detachable cooler configured to be positioned in a location adjacent to the inner surface of the rotatable EUV source vessel and substantially opposite to the heating area.

3. The extreme ultraviolet (EUV) radiation source of claim 1, wherein the first aperture is configured to be an exit of the reflowed fuel debris.

4. The extreme ultraviolet (EUV) radiation source of claim 1, further comprising a second aperture at another end of the inner surface of the rotatable EUV source vessel, wherein the second aperture is configured to allow the EUV radiation to exit the rotatable EUV source vessel.

5. The extreme ultraviolet (EUV) radiation source of claim 1, further comprising a collector detachable from the rotatable EUV source vessel, wherein the collector is an optical element and has an opening for allowing the laser beam to pass through.

6. The extreme ultraviolet (EUV) radiation source of claim 1, further comprising a fuel droplet generator configured to provide a plurality of fuel droplets to the rotatable EUV source vessel.

7. The extreme ultraviolet (EUV) radiation source of claim 1, wherein the fuel droplets include tin.

8. The extreme ultraviolet (EUV) radiation source of claim 1, wherein the rotatable EUV source vessel further includes a controller configured to coordinate the heating area and the rotation speed.

9. The extreme ultraviolet (EUV) radiation source of claim 1, wherein the rotatable EUV source vessel further includes a debris-collection element configured to collect fuel debris exiting from the first aperture of the rotatable EUV source vessel.

10. The extreme ultraviolet (EUV) radiation source of claim 1, wherein the rotatable EUV source vessel includes a plurality of strip-shaped heaters adjacent to the inner surface.

11. The extreme ultraviolet (EUV) radiation source of claim 10, wherein the inner surface has a groove.

12. The extreme ultraviolet (EUV) radiation source of claim 1, wherein the heater is detachable.

13. The extreme ultraviolet (EUV) radiation source of claim 1, wherein the laser beam include a carbon dioxide ($CO_2$) laser.

14. A method for generating extreme ultraviolet (EUV) radiation, comprising:
    collecting fuel debris on an inner surface of a rotatable EUV source vessel,
    rotating the rotatable EUV source vessel at a rotation speed, and
    heating a portion of the rotatable EUV source vessel to an elevated temperature to generate a heating area on the inner surface in coordination with the rotation speed, wherein the fuel debris is reflowed to the heating area.

15. The method of claim 14, further comprising cooling another portion of the rotatable EUV source vessel to a reduced temperature to generate a warm area on the inner surface in coordination with the rotation speed.

16. The method of claim 15, wherein the fuel debris is reflowed to the heating area and attached to the warm area.

17. The method of claim 14, further comprising generating EUV radiation while the rotatable EUV source vessel is kept rotating at the rotation speed.

18. The method of claim 14, further comprising collecting the reflowed fuel debris while the rotatable EUV source vessel is kept rotating at the rotation speed.

19. A method for generating extreme ultraviolet (EUV) radiation, comprising:
    collecting fuel debris on an inner surface of a rotatable EUV source vessel,
    rotating the rotatable EUV source vessel at a rotation speed,
    heating a portion of the rotatable EUV source vessel to an elevated temperature to generate a heating area on the inner surface and cooling another portion of the rotatable EUV source vessel to a reduced temperature to generate a warm area on the inner surface in coordination with the rotation speed, wherein the fuel debris is reflowed to the heating area and attached to the warm area, and
    collecting the reflowed fuel debris while the rotatable EUV source vessel is kept rotating at the rotation speed.

20. The method of claim 19, further comprising generating EUV radiation while the rotatable EUV source vessel is kept rotating at the rotation speed.

* * * * *